United States Patent [19]
Okeda

[11] Patent Number: 5,092,080
[45] Date of Patent: Mar. 3, 1992

[54] APPARATUS FOR OPENING AND CLOSING CORE TUBE

[75] Inventor: Tatsuo Okeda, Kamakura, Japan

[73] Assignee: Kabushiki Kaisha Toshiba, Kawasaki, Japan

[21] Appl. No.: 588,722

[22] Filed: Sep. 27, 1990

[30] Foreign Application Priority Data

Sep. 29, 1989 [JP] Japan .................................. 1-254665

[51] Int. Cl.⁵ .............................................. E06B 3/00
[52] U.S. Cl. ...................................................... 49/507
[58] Field of Search ........................................... 49/507

[56] References Cited

FOREIGN PATENT DOCUMENTS 58-122723  7/1983  Japan .
285926    11/1988  Japan .
1-46921    2/1989  Japan .
1-316928  12/1989  Japan .

Primary Examiner—Renee S. Luebke
Assistant Examiner—Jerry Redman
Attorney, Agent, or Firm—Foley & Lardner

[57] ABSTRACT

It is necessary to close an open end of a core tube when a fork is charged or not charged in the core tube and an apparatus for opening and closing the core tube comprises a first and second lid members which are operated independently. The first lid member is utilized at a time when the fork is charged and is provided with a fork charging portion having a configuration corresponding to that of the fork. The first lid member is composed of a pair of door members formed to be openable by dividing the first lid member at a central portion thereof, the door members being provided with cutouts, respectively, constituting the fork charging portion when the door members are closed. The second lid member is utilized at a time when the fork is not charged and is provided with a solid structure. The first and second lid members are independently swung and moved forward and backward with respect to an open end face of the core tube.

5 Claims, 3 Drawing Sheets

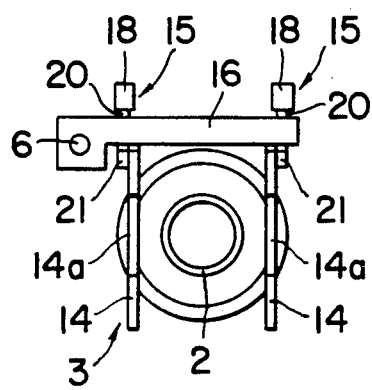
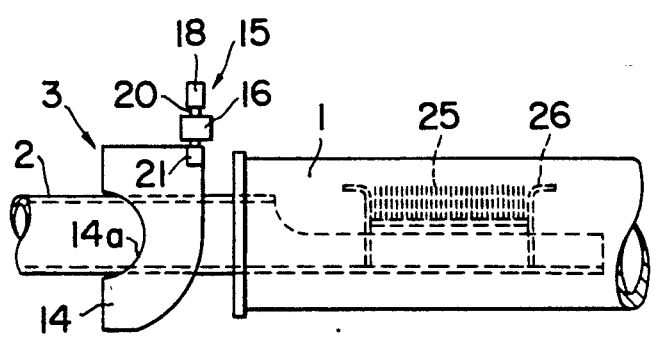
FIG. 4  FIG. 5
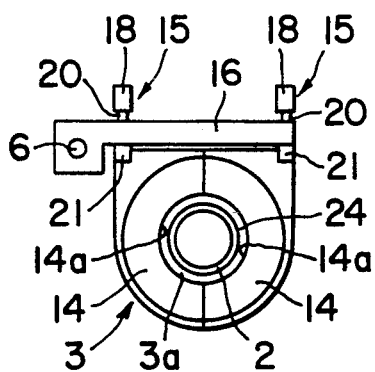
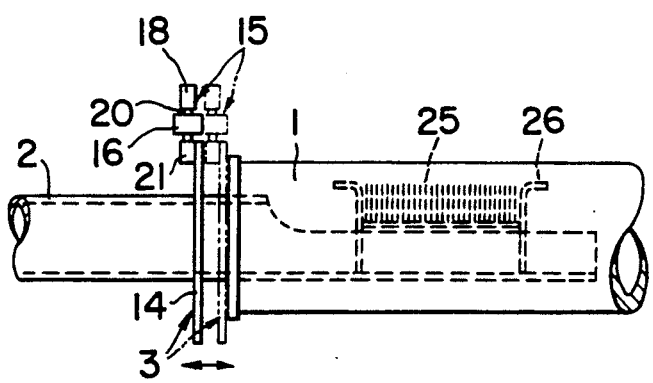
FIG. 6  FIG. 7

APPARATUS FOR OPENING AND CLOSING CORE TUBE

BACKGROUND OF THE INVENTION

The present invention relates to an apparatus for opening and closing an open end face of a core tube utilized at a time when a fork is charged or uncharged, that is, when a fork is inserted or not inserted in the core tube.

In general, it is necessary for a core tube to close the open end face thereof with a fork being charged thereinto in a case, for example, where a semiconductor wafer oxidation diffusion process is carried out in the core tube and, accordingly, in a known art, there is provided a core tube opening and closing apparatus capable of opening or closing the open end face of the core tube in the two modes of when a fork is charged and when a fork is not charged.

One typical example of a conventional core tube opening and closing apparatus disposed in front of the core tube includes two lid members made of silica plates in shape of discs utilized at times when a fork is charged and not charged.

One of the lid members utilized at the time when the fork is charged is composed of a hollow fork charging portion having a shape corresponding to an outer shape of the fork to be charged and a fork guiding portion formed continuous to one end side of the fork charging portion. The lid members are constructed to be independently swingable as well as movable backward and forward by lid member moving mechanisms, respectively.

When a fork is charged (inserted into the core tube), one of the lid members utilized when the fork is charged is swung towards the core tube so that the center of the lid member aligns with the axis of the core tube. The fork is positioned in the fork charging portion through the fork guiding portion through this operation. The lid member is then moved towards the core tube until the lid member abuts against the open end face of the core tube thereby closing the open end face thereof.

On the other hand, when the fork is uncharged, the other lid member utilized when the fork is uncharged is swung into position so that the center of the lid member aligns with the axis of the core tube. The lid member then advances towards the core tube until it abuts against the open end face of the core tube and thereby closes it.

In the conventional core tube opening and closing apparatus of the structure described above, the open end face of the core tube is closed by the lid member when the fork is charged. However, the lid member is provided with the fork charging portion and the fork guiding portion which is continuous to the fork charging portion and which is provided with an open end through which the fork passes. Accordingly, there is the fear that intruding cold air or dust may enter into the interior of the core tube through the open end of the fork guiding portion, i.e. the lid member, affecting the stable temperature distribution in the reactor core and adhering to the semiconductor wafer to lower the yield.

SUMMARY OF THE INVENTION

An object of the present invention is to substantially eliminate the defects or drawbacks encountered in the prior art described above and to provide a core tube opening and closing apparatus capable of preventing cold air or dust from entering the core tube when a fork is charged into the core tube, to thereby maintain stable temperature distribution in the core tube and improve the yield of semiconductor wafers in one preferred embodiment, for example.

This and other objects can be achieved according to the present invention by providing an apparatus for opening and closing a core tube into which a fork is charged, comprising a first lid member utilized when the fork is charged and provided with a fork charging portion having a configuration corresponding to that of the fork, the first lid member comprising a pair of door members formed to be openable by dividing the first lid member at a central portion thereof, the door members being provided with cutouts, respectively, constituting the fork charging portion when the door members are closed, a mechanism for opening and closing the door members, a second lid member utilized at a time when the fork is uncharged and provided with a solid structure, and a mechanism for operating the first and second lid members independently of each other to be swung and moved forward and backward with respect to an open end face of the core tube.

According to the core tube opening and closing apparatus of the structure described above, when it is required to charge the fork into the core tube, the lid member utilized for charging the fork is first swung towards the core tube to a position in front of the open end of the core tube. The door members of this lid member are opened and the fork is inserted into the core tube through the opened door members and, thereafter, the door members are closed with the fork being partially disposed the circular hole formed by the cutouts of the door members. In this state, the lid member is moved forward to close the open end portion of the core tube, whereby the fork is charged into the core tube without being provided with a fork guiding portion, as described in the prior art, and without being open to the atmosphere so that cold air and dust are prevented from entering into the core tube such that a stable temperature distribution is maintained in the core tube, and the yield of products is improved. The position of the cutouts can be easily adjusted to the fork charging position by shifting the lid member.

BRIEF DESCRIPTION OF THE DRAWINGS

In the accompanying drawings:

FIG. 4 is a front view of the apparatus applied to a core tube in which a lid member with door members opened is positioned in front of the core tube;

FIG. 5 is a side view of FIG. 4;

FIG. 6 is a front view of the apparatus applied to the core tube in which the lid member with the door members being closed is positioned in front of the core tube;

FIG. 7 is a side view of FIG. 6;

DESCRIPTION OF THE PREFERRED EMBODIMENT

For a better understanding of the present invention, one typical example of a conventional core tube opening and closing apparatus will be described hereunder with reference to FIGS. 8 and 9.

Figure 8:
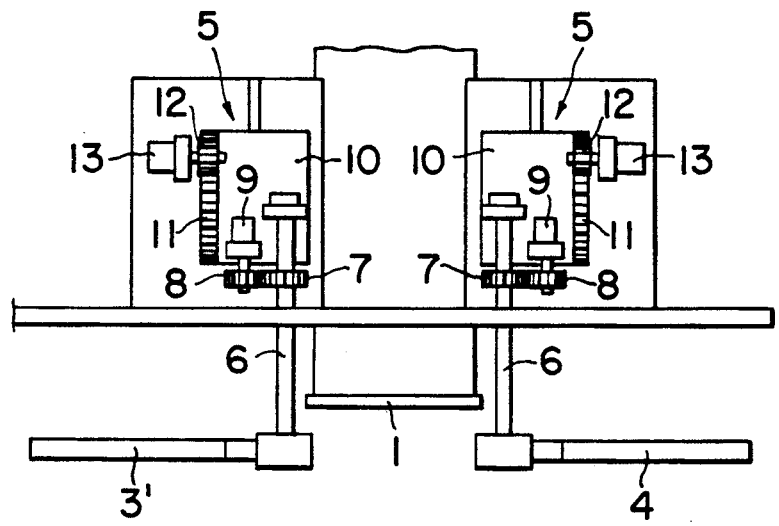
FIG. 8 is a plan view of a conventional core tube opening and closing apparatus.
Figure 9:
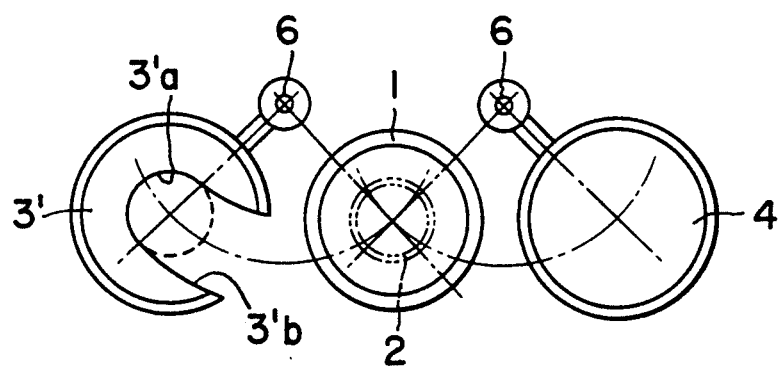
FIG. 9 is a front view of the apparatus shown in FIG. 8.

Referring to FIGS. 8 and 9, a lid member 3' of disc shape and made of a silica plate, for example, and utilized at a time when a fork 2 is charged, and a lid member 4 of solid disc shape made of a silica plate, for example, and utilized at a time when the fork 2 is uncharged, are arranged in front of a core tube 1 of cylindrical shape. The lid member 3' is composed of a fork charging portion 3'a having a shape corresponding to an outer shape of the fork 2 to be charged, and a fork guiding portion 3'b formed continuous to one end side of the fork charging portion 3'. The lid members 3' and 4 are constructed to be independently swingable and movable backward and forward by lid member moving mechanisms 5 and 5, respectively.

The lid member moving mechanisms 5 and 5 have substantially the same structure as each other and each of them comprises a motor 9, a rotation shaft 6 driven by the motor 9 through gears 7 and 8, a base 10 supporting the motor 9 and the rotation shaft 6, and a motor 13 for moving backward and forward the motor by way of a rack gear 11 and a pinion gear 12. The lid members 3' and 4 are provided with end projections to which the front ends of the respective rotation shaft 6 and 6 are connected so that the lid members 3' and 4 are swung in the axial direction of the core tube 1 in accordance with the rotation of the rotation shafts 6 and moved backward and forward in accordance with the back and forth movement of the rotation shafts 6 in accordance with the movement of the bases 10.

In the fork charging time, one of the rotation shafts 6 is rotated with the fork 2 being charged to thereby swing the lid member 3', utilized at the fork charging time, towards the core tube 1 so that the center of the lid member 3' aligns with the axis of the core tube 1. The fork 2 is positioned in the fork charging portion 3'a through the fork guiding portion 3'b through this operation. The fork charging portion 3'a is moved towards the core tube 1 with the lid member 3' abuts against the open end face to thereby close the open end face of the core tube 1.

On the other hand, when the fork is not charged, the other rotation shaft 6 is rotated towards the core tube 1. The lid member 4 utilized when the fork is not charged is swung so that the center of the lid member 4 aligns with the axis of the core tube 1. The lid member 4 then advances towards the core tube 1 to abut against the open end face of the core tube 1 and thereby close the same.

In the conventional core tube opening and closing apparatus of the character described above, the open end face of the core tube 1 is closed by the lid member 3' at the time when the fork is charged. However, the lid member 3' is provided with the fork charging portion 3'a and the fork guiding portion 3'b which is continuous to the fork charging portion and which is provided with the open end through which the fork 2 passes. Accordingly, there is a concern that cold air or dust will enter into the interior of the core tube through the open end of the fork guiding portion 3'b, i.e. the lid member 3', and affect on the temperature distribution in the reactor core and the dust may stick to the semiconductor wafer, and thereby lower the yield.

One preferred embodiment according to the present invention conceived for eliminating the defects or drawbacks encountered in the prior art described above will be described hereunder with reference to FIGS. 1 to 7.

A lid member 3 utilized at a time when a fork 2 is charged, and a lid member 4 utilized at a time when the fork 2 is uncharged, are arranged in front of a cylindrical core tube 1. The lid member 3 is made of a silica plate having a fork charging portion 3a having a shape corresponding to an outer configuration of the fork 2, and the lid member 4 is made of a silica plate having a solid disc shape.

The lid member 3 is composed of a pair of opening and closing door members 14 and 14 formed by dividing the lid member 3 at the central portion thereof, and each of the opening and closing door members 14 and 14 is supported at one portion on the outside surface thereof by a connection rod 16 to be rotatable through a door opening and closing mechanism 15.

Figure 1:
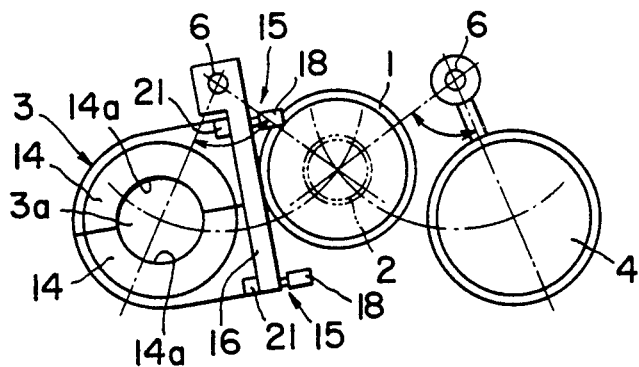
FIG. 1 is a front view of a core tube opening and closing apparatus according to the present invention.
Figure 3A:
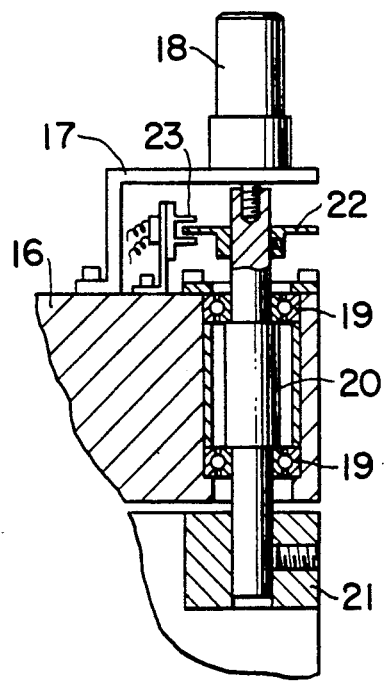
FIG. 3A is an enlarged sectional view, partially broken away, of a door opening and closing mechanism of the apparatus shown in FIG. 1.
Figure 2:
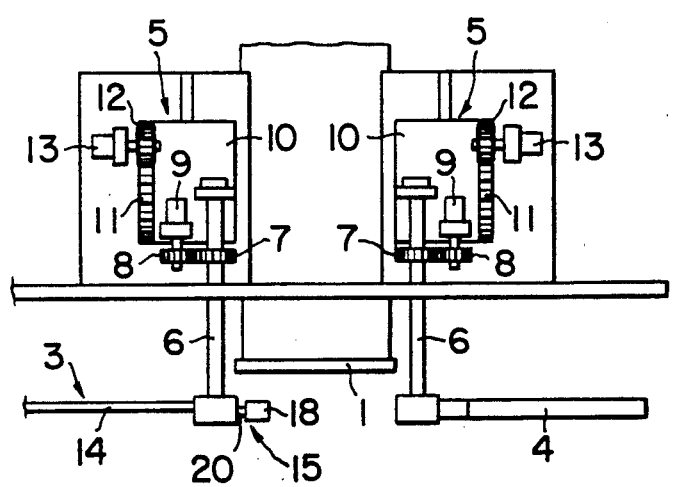
FIG. 2 is a plan view of the apparatus shown in FIG. 1.
Figure 3B:
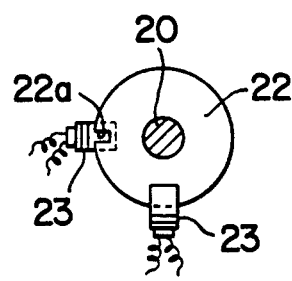
FIG. 3B is a brief plan view of a rotation angle detection plate.

Namely, as shown in FIG. 3 in detail, each of the door opening and closing mechanisms 15 comprise a motor 18 mounted to the connection rod 16 through a bracket 17, a support shaft 20 which has an upper, as viewed, end operatively connected to the motor 18 to be rotatable together with the motor 18 and which is disposed in the connection rod 16 to be rotatable through bearings 19 and 19, and a block 21 which is secured to the surface of the opening and closing door member 14 and to which the lower end of the support shaft 20 is connected so as not to be rotatable.

According to the structure of the door opening and closing mechanism 15, the support shaft 20 is rotated in response to the rotation of the motor 18 and the opening and closing door members 14 and 14 are forwardly rotated by 90° through the block 21 in accordance with the rotation of the support shaft 20 to thereby open or close the door members.

The rotation of the support shaft 20 is detected by a rotation angle detection device 22 in the shape of a plate secured to the support shaft 20 and limit switches 23 and 23 are arranged at portions shifted in angle by 90° so as to snap the peripheral edge of the rotation angle detection plate 22. The rotation angle detection plate 22 is provided with a slit 22a through which the rotation of 90° of the support shaft 20, i.e. the detection plate 22, is detected by the limit switches 23 and 23.

These two opening and closing door members 14 and 14 are provided with abutting portions in which semicircular cutouts 14a and 14a are formed respectively so as to form a fork charging opening 3a having a circular shape substantially corresponding to the outer configuration of the fork 2, but providing a minimum gap 24 (FIG. 6) between the outer peripheral surface of the fork 2 and the inner peripheral surface of the fork charging portion 3', when the door members 14 and 14 are closed and the semicircular cutouts 14a and 14a are mated together in a circular hole.

According to the structure described above, as shown in FIGS. 4 and 5, in a case where it is required to charge the fork 2 into the core tube 1, the lid member 3 utilized at the time when the fork is charged is first arranged in front of the core tube 1 with the opening and closing door members 14 and 14 being opened. In this condition, the fork 2 is charged into the core tube 1 and, thereafter, the door members 14 and 14 are closed as shown in FIGS. 6 and 7 in which the fork 2 is partially disposed in the circular fork charging portion 3a formed by the semicircular cutouts 14a and 14a of the opening and closing door members 14 and 14. In this condition, the open end of the core tube 1 is closed by the lid member 3 by moving the lid member 3 towards the core tube 1. Accordingly, this structure can eliminate the formation of the fork guiding portion 3'b (FIG. 9) and the entire peripheral surface of the fork 2 can be shut out with the minimum gap 24.

The lid members 3 and 4 respectively utilized at times when the fork 2 is charged and not charged are independently swung and moved backward and forward, respectively, through the lid member moving mechanisms 5 and 5.

The lid member moving mechanisms 5 and 5 have substantially the same structure as each other and each of them comprises a motor 9, a rotation shaft 6 driven by the motor 9 through gears 7 and 8, a base 10 supporting the motor 9 and the rotation shaft 6 and a motor 13 for moving the motor backward and forward by way of a rack gear 11 and a pinion gear 12. The front end portion of one of the rotation shafts 6 is secured to the end of the connection rod 16 and to the front end of the other rotation shaft 6 is secured the lid member 4 through a projection so that the lid member 3 or 4 can be swung in the axial direction of the core tube 1 in accordance with the rotation of the rotation shafts 6 and moved backward and forward in accordance with the back and forth movement of the rotation shafts 6 in accordance with the movement of the bases 10.

The present invention will be described hereunder by way of a semiconductor wafer oxidation diffusion treatment as a preferred example in conjunction with FIGS. 4 to 7.

The charging of the fork 2 supporting, on the front end portion thereof, a boat 26 having a material 25 to be treated such as semiconductor wafer into the core tube will be carried out in the following manner.

The lid member 3 utilized at the time when the fork is charged is swung to the extent that the central portion thereof aligns with the axis of the core tube 1 and, thereafter, the fork 2 supporting the boat 26 is guided into the interior of the core tube 1 (FIGS. 4 and 5) with the opening and closing door members 14 and 14 of the lid member 3 being opened. The door members 14 and 14 are then closed and, under this condition, the lid member 3 advances towards the core tube until the lid member 3 abuts against the open end face of the core tube 1 and thereby closes the end face (FIGS. 6 and 7).

Thereafter, the fork 2 is moved further forward into the core tube 1 and is stopped when the material 25 to be treated reaches the predetermined position in the core tube 1. The lid member 3 is then moved backward from the core tube 1 and the opening and closing door members 14 and 14 are opened. Under this condition, the fork 2 is lowered to put the boat 26 accommodating the material 25 to the predetermined position in the core tube 1 and the fork 2 is thereafter drawn out from the boat 26.

In the next step, in the like manner, the open end face of the core tube 1 is closed by the lid member 3 and the fork 2 is entirely drawn out from the core tube 1. The lid member 3 is again retracted from the core tube 1 and swung in a direction away from the axis of the core tube 1.

In the next step, the lid member 4 utilized at the time when the fork is uncharged is swung till the central portion of the lid member 4 aligns with the axis of the core tube 1 and is moved forward towards the core tube 1 to abut against the open end face thereof to hermetically close the open end face.

Taking out the boat 26 after the material 25 has been subjected to the oxidation diffusion treatment in the core tube is performed in the following manner.

The lid member 4 is first moved backward from the core tube 1 and, thereafter, swung in a direction away from the axis of the core tube 1.

The other lid member 3 for the fork charging is then swung till the central portion of the lid member 3 is in alignment with the axis of the core tube 1. The fork 2 is guided into the core tube 1 with the door members 14 and 14 being opened. After the guiding of the fork 2, the door members 14 and 14 are closed and, under the door closing condition, the lid member 3 is moved towards the core tube 1 to abut against the open end face of the core tube 1 to thereby close the same. Thereafter the fork 2 is further moved forward in the core tube 1.

When the fork 2 reaches the predetermined position in the core tube 1, the advance of the fork 2 stops. The lid member 3 is then moved backward to separate from the open end face of the core tube 1 and the door members 14 and 14 are opened. Under the door opened condition, the fork 2 scoops the boat 26 disposed in the core tube for the necessary treatment and holds the same.

In the next step, the open end face of the core tube 1 is closed by the lid member 3 and, under this condition, the fork 2 is moved backward and stopped when the boat 26 supported by the fork 2 is moved at a portion near the open end of the core tube 1. The door members 14 and 14 are then moved backward by the manner described before to open them and the boat 26 is drawn out from the core tube 1. Thereafter, the lid member 3 is closed and swung in a direction away from the axis of the core tube 1.

The other lid member 4, for the uncharged situation, is swung so that the central portion thereof aligns with the axis of the core tube 1 and then advances towards the open end face of the core tube 1 till the same abuts against the open end face to hermetically seal the open end face.

It is to be understood that the present invention is not limited to the described preferred embodiment and many other changes and modifications may be made without departing from the scope of the appended claims.

What is claimed is:

1. An apparatus for opening and closing a core tube having an open end face into which a fork is inserted, comprising:
    a first lid member utilized at a time when said fork is inserted in said core tube and having a fork inserting portion which has a configuration corresponding to that of the fork, said first lid member having a pair of door members formed to be dividable at a central portion thereof, said door members being provided with cutouts, respectively, said cutouts constituting said form inserting portion when said door members are closed;
    means for opening and closing said door members having a connection rod which is rotatable on a surface which is normal to the axis of said core tube, and a pair of door opening and closing mechanisms provided on said connection rod, each of said door opening and closing mechanisms supporting at least one of said door members and rotating the same about an axis which is disposed on said normal surface and which is normal to said connection rod;

a second lid member, utilized at a time when said fork is not inserted in said core tube, and having a solid structure; and operating means for operating said first and second lid members independently from each other such that said first and second lid members are swung and moved forward and backward with respect to said open end face of said core tube.

2. The apparatus according to claim 1, wherein said first and second lid members are disc shaped and made of silica plate.

3. The apparatus according to claim 1, wherein each of said cutouts forming the fork inserting portion has a semicircular shape such that a circular hole is formed when the cutouts are mated, and a minimum gap exists between an inner periphery of the circular hole and an outer periphery of the fork when the fork is disposed in the circular hole.

4. The apparatus according to claim 1, wherein each of said door opening and closing mechanisms comprises a motor mounted on the connection rod through a bracket, a support shaft extending within said connection rod and having a first end connected to the motor and a second end connected to at least one of said door members.

5. The apparatus according to claim 4, wherein each of these door opening and closing mechanisms comprises detecting means for detecting a rotation angle of the support shaft.

* * * * *